United States Patent

Abrokwah et al.

Patent Number: 5,614,739
Date of Patent: *Mar. 25, 1997

[54] HIGFET AND METHOD

[75] Inventors: Jonathan K. Abrokwah, Tempe; Rodolfo Lucero, Scottsdale; Jeffrey A. Rollman, Phoenix, all of Ariz.

[73] Assignee: Motorola, Schaumburg, Ill.

[*] Notice: The term of this patent shall not extend beyond the expiration date of Pat. No. 5,514,891.

[21] Appl. No.: 459,854

[22] Filed: Jun. 2, 1995

[51] Int. Cl.$^6$ ............... H01L 31/0328; H01L 31/0336; H01L 29/76

[52] U.S. Cl. ................ 257/192; 257/194; 257/346

[58] Field of Search .................. 257/192, 194

[56] References Cited

U.S. PATENT DOCUMENTS 4,916,498   4/1990   Berenz ................... 257/194
5,514,891   5/1996   Abrokwah et al. ........... 257/346

FOREIGN PATENT DOCUMENTS 60-4268     1/1985   Japan ..................... 257/282
1-170051    7/1989   Japan ..................... 257/283

*Primary Examiner*—Wael Fahmy
*Attorney, Agent, or Firm*—Eugene A. Parsons

[57] ABSTRACT

A HIGFET (10) utilizes an etch stop layer (17) to form a gate insulator (16) to be narrower than the gate electrode (21). This T-shaped gate structure facilitates forming source (23) and drain (24) regions that are separated from the gate insulator (16) by a distance (22) in order to reduce leakage current and increase the breakdown voltage.

7 Claims, 1 Drawing Sheet

HIGFET AND METHOD

BACKGROUND OF THE INVENTION

The present invention relates, in general, to semiconductor transistors, and more particularly, to heterostructure transistors.

Heterostructure insulated gate field effect transistors (HIGFET's) are well known to those skilled in the art and are widely used for a variety of applications including complementary digital circuits. These prior HIGFET's generally are formed by growing a high mobility channel layer on a gallium arsenide substrate, followed by an aluminum gallium arsenide insulator covering the channel layer. A refractory metal gate is applied on the portion of the insulator. Other portions of the insulator extend over other portions of the transistor including source and drain areas, and generally covers the entire transistor.

One problem with these prior HIGFET's is the high gate leakage current. In complementary circuits, this high leakage current increases the standby power dissipation.

Also, N-type HIGFET's have a turn-on voltage, typically about 1.5 volts, that is lower than P-type HIGFET's, generally about 1.8 volts. This low turn-on voltage also results in high standby power dissipation.

Accordingly, it is desirable to have HIGFETs that have a low gate leakage current.

DETAILED DESCRIPTION OF THE DRAWINGS

Figure 1:
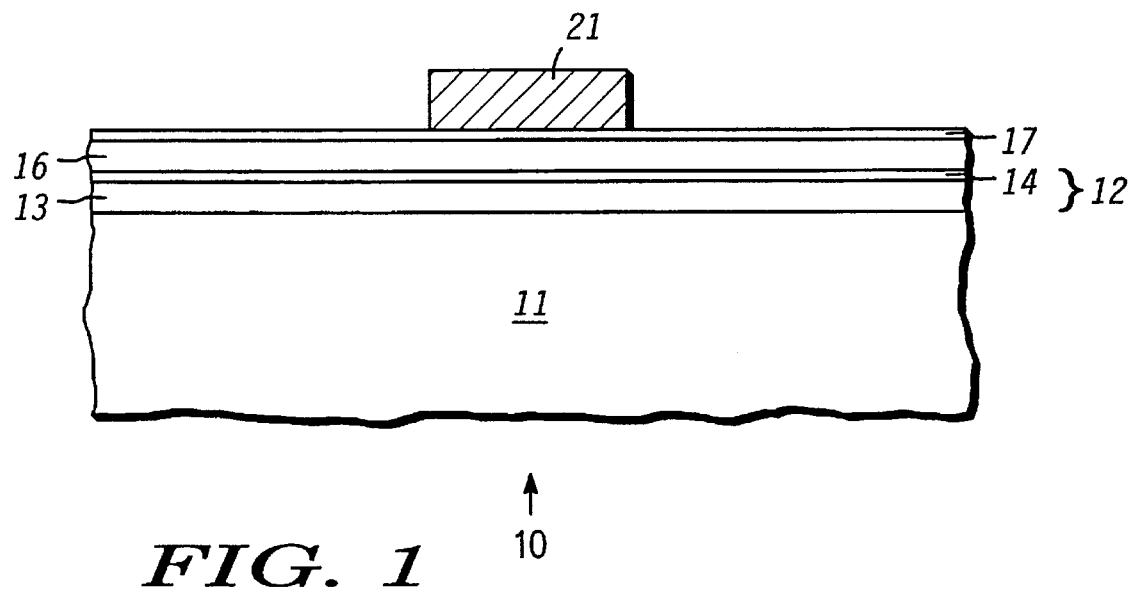
FIG. 1 illustrates an enlarged cross-sectional portion of a HIGFET at a stage in manufacturing in accordance with the present invention.

FIG. 1 illustrates an enlarged cross-sectional portion of a HIGFET 10 at a stage of manufacturing. As will be apparent in the hereinafter explanation, transistor 10 can be either N-type or P-type, and could be one or represent both transistors of a complementary pair. Transistor 10 has a III–V substrate 11 that includes a channel layer 12 formed by epitaxial techniques that are well known to those skilled in the art. Channel layer 12 forms a heterojunction with substrate 11. Substrate 11 can be any well-known III–V material such as gallium arsenide, indium phosphide, or ternary materials such as indium gallium arsenide. In the preferred embodiment, substrate 11 is semi-insulating gallium arsenide. Channel layer 12 can include a variety of III–V materials that have a high mobility such as indium gallium arsenide. In the preferred embodiment, channel layer 12 includes an indium gallium arsenide high mobility layer 13 that is covered by a protective layer 14. As will be seen hereinafter, protective layer 14 is a layer of substantially intrinsic gallium arsenide that is utilized to protect layer 14 during subsequent processing operations. In other embodiments, protective layer 14 may be omitted.

A high aluminum content insulator 16 is formed on channel layer 12 and results in a heterojunction therebetween. Insulator 16 will subsequently be patterned to form the gate insulator of transistor 10. Insulator 16 has an aluminum content greater than 50 percent so that insulator 16 has a high bandgap and to permit selective etching of insulator 16 as will be seen hereinafter. For example, insulator 16 can be aluminum gallium arsenide ($Al_xGa_{1-x}As$) for a gallium arsenide substrate 11, or aluminum indium arsenide ($Al_xIn_{1-x}As$) in the case of an indium phosphide substrate 11, or other high aluminum content insulator that is compatible with the material used for layer 12. In the preferred embodiment, insulator 16 is AlGaAs having an aluminum content between approximately seventy and eighty percent. Also in the preferred embodiment, insulator 16 is approximately 200–300 angstroms thick in order to ensure high transconductance.

An etch stop layer 17 is formed on insulator 16 in order to facilitate selectively etching overlying layers as will be seen hereinafter. Layer 17 also serves to prevent oxidation of insulator 16. The material utilized for layer 17 generally is not etched by procedures and chemicals that will etch underlying insulator 16, for example substantially intrinsic gallium arsenide or substantially intrinsic indium gallium arsenide.

In the preferred embodiment, layer 17 is substantially intrinsic gallium arsenide that is less than approximately fifty angstroms because such thickness is sufficient as an etch stop, and to prevent over-etching other layers as will be seen hereinafter. A gate material is applied to layer 17 and patterned to form a gate electrode or gate 21. The material utilized for gate 21 typically is a refractory metal, for example an alloy of titanium-tungsten-nitride (TiWN), tungsten-nitride (WN), or tungsten-silicide (WSi). Gate 21 generally is formed by applying a layer of the gate material to the surface of layer 17 and then removing all but the portion forming gate 21. In the preferred embodiment, a reactive ion etch is used to form gate 21.

Figure 2:
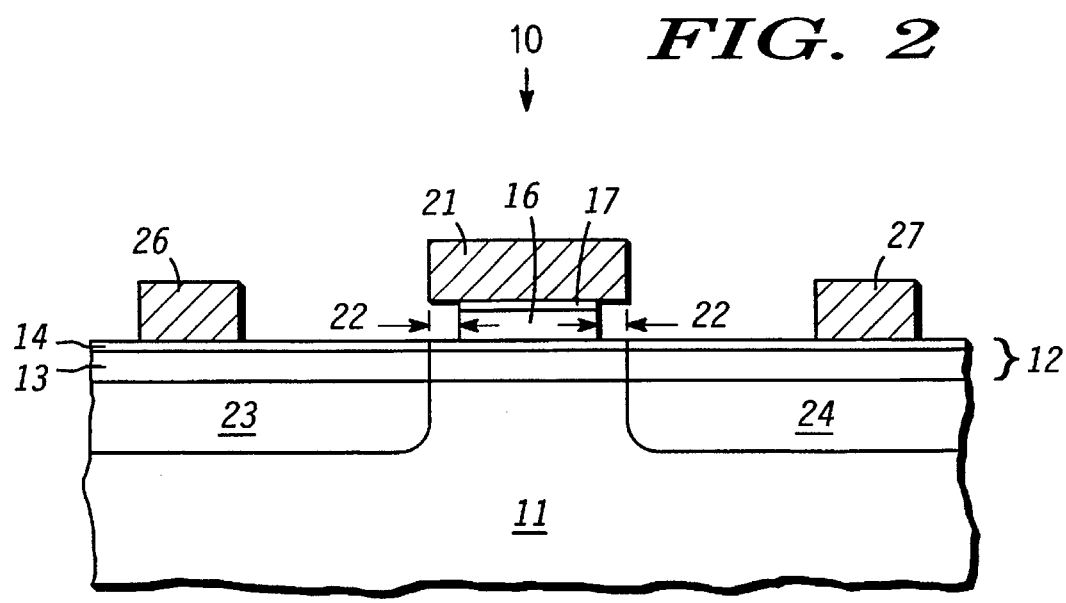
FIG. 2 illustrates the HIGFET of FIG. 1 after subsequent processing operations in accordance with the present invention.

FIG. 2 illustrates an enlarged cross-sectional portion of transistor 10 in a subsequent stage of manufacturing. Gate 21 is utilized as a mask for undercutting material from gate 21 to form a T-shaped gate structure wherein gate 21 is a cross-member of the T-shaped structure, and underlying layers form a base of the T-shaped structure. After patterning gate 21, exposed portions or a first portion of layer 17 that is not covered by gate 21 is removed. This operation also undercuts gate 21 as a second portion of layer 17 is also removed under the edges of gate 21. Underlying insulator 16 serves as an etch stop which prevents the removal operation from affecting underlying portions of transistor 10. The removal operation also exposes a first portion of insulator 16. In the preferred embodiment, citric acid is utilized to etch layer 17.

Subsequently, a first portion or the exposed portion of insulator 16 is removed by using an etchant that does not affect gate 21 or layer 17. A dielectric layer, such as silicon nitride, may first be applied on gate 21, and defined and etched prior to forming gate 21 in order to protect gate 21 from subsequent etching operations. In the preferred embodiment, a one-to-one solution of water and hydrochloric acid at forty degrees Celsius (40° C.) is used. While removing the first portion of insulator 16, a first portion of layer 12 is exposed. This first portion of layer 12 serves as an etch stop to prevent affecting other layers of transistor 10.

Thereafter, gate 21 is utilized as a mask for forming dopants in substrate 11 in order to form a source region 23 and drain region 24 of transistor 10. After activating the dopants, a source electrode 26 is formed on region 23 and a drain electrode 27 is formed on region 24.

Insulator 16 and layer 17 function as a base of the T-shaped gate structure, and support the cross-member formed by gate 21. By utilizing this T-shaped gate structure as a mask while forming source region 23 and drain region 24, an edge of each region 23 and 24 is separated from an edge of insulator 16 by a first distance 22. In the preferred embodiment, distance 22 is approximately fifty to one thousand angstroms (50 to 1000 Å). Because insulator 16 is separated from source region 23 and drain region 24, distance 22 results in reduced perimetric gate leakage current by minimizing the drain induced hot electron current flow between gate 21 and drain region 24, and also by reducing trap formation near regions 23 and 24. Distance 22 also increases the breakdown voltage of transistor 22 by reducing the electric field between gate 21 and drain region 24. As a result, transistor 10 has a gate leakage current that is approximately ten times lower than prior art HIGFETs. Additionally, distance 22 also increases the breakdown voltage of transistor 10 by at least two times the breakdown voltage of prior art HIGFETs.

It should be noted that transistor 10 can be either an N-type or P-type transistor. Also, transistor 10 can be used as a single transistor, or in an integrated circuit with other types of transistors, or used to form N-type and P-type transistors in a complementary pair of transistors.

By now it should be appreciated that there has been provided a novel HIGFET and method. Utilizing a high aluminum content insulator covered by an etch stop layer facilitates selectively etching material underlying the gate in order to form a T-shaped gate structure. Utilizing the T-shaped gate structure as a mask while forming source and drain implants results in a distance between the gate insulator and the source and drain regions, thereby reducing perimetric gate leakage current and increasing breakdown voltage.

We claim:

1. A HIGFET comprising:
   a III–V substrate having a channel layer;
   a T-shaped gate structure having a cross-member supported by a base, the base having an insulator positioned on a first etch stop layer in the substrate, and a second etch stop layer on the insulator, wherein the base has a width that is less than a width of the cross-member; and
   a doped region in the substrate wherein an edge of the doped region is a first distance from an edge of the insulator.

2. The HIGFET of claim 1 wherein the insulator does not overlay the doped region.

3. The HIGFET of claim 1 wherein the insulator has an aluminum arsenide content of at least 50%.

4. The HIGFET of claim 3 wherein the insulator is one of aluminum gallium arsenide or aluminum indium arsenide.

5. The HIGFET of claim 1 wherein the first etch stop layer is substantially intrinsic gallium arsenide and the second etch stop layer is substantially intrinsic aluminum arsenide.

6. The HIGFET of claim 1 wherein the first distance is approximately 50 to 1000 angstroms.

7. The HIGFET of claim 1 wherein the channel layer includes a layer of substantially intrinsic gallium arsenide on a layer of indium gallium arsenide.

* * * * *